United States Patent [19]  [11] Patent Number: 4,650,950
Hayakawa et al.  [45] Date of Patent: Mar. 17, 1987

[54] SOLDERING APPARATUS

[75] Inventors: Futomi Hayakawa, Tokyo; Kazuo Onoda, Saitama, both of Japan

[73] Assignee: HY-BEC Corporation, Tokyo, Japan

[21] Appl. No.: 809,405

[22] Filed: Dec. 16, 1985

[30] Foreign Application Priority Data

Dec. 14, 1984 [JP] Japan ................................. 59-262691

[51] Int. Cl.$^4$ ............................................... B23K 1/12
[52] U.S. Cl. .............................. 219/85 BA; 219/85 R; 219/349
[58] Field of Search ........... 219/85 BA, 85 BM, 85 F, 219/85 R, 85 M, 349

[56] References Cited

U.S. PATENT DOCUMENTS

| 2,318,533 | 5/1943 | Selvig | 219/349 X |
| 3,486,004 | 12/1969 | Morrone | 219/85 BA |
| 3,520,055 | 7/1970 | Jannett | 219/121 LC X |
| 3,522,407 | 8/1970 | Costello | 219/85 BA |
| 3,683,146 | 8/1972 | Nugent et al. | 219/349 X |

FOREIGN PATENT DOCUMENTS

| 635733 | 12/1963 | Belgium | 219/85 F |
| 491457 | 2/1976 | U.S.S.R. | 219/60.2 |

Primary Examiner—E. A. Goldberg
Assistant Examiner—C. M. Sigda
Attorney, Agent, or Firm—Young & Thompson

[57] ABSTRACT

Soldering apparatus for effecting, for example, a firm connection of the lead pins on IC-packages to a printed circuit board bearing corresponding lead lines. The workpiece such as an IC-package is placed at a predetermined position on the printed circuit board such that the lead pins on the IC-package and the corresponding lead lines on the circuit board, on which the solder has been applied, are in contact with each other. These sites of contact are subjected to radiant heating to cause soldering of them, by the use of apparatus which comprises a mounting base provided with a pair of diagonally disposed arms together with, if necessary, another pair of arms disposed also diagonally but rectangularly to the first pair of arms. Heat sources such as lamp units produce the radiant heat rays and focus them onto the sites of contact of the lead pins with the lead lines to be soldered. Each of the lamp units is hingedly connected to the distal end of each of the arms so as to permit individual adjustment of the angle of inclination of the lamp unit around an axis of angular adjustment. A support shaft adjustable as to its vertical position relative to the work table passes slidably through the mounting base and supports a press plate for bearing the IC-package at its lower end.

6 Claims, 10 Drawing Figures

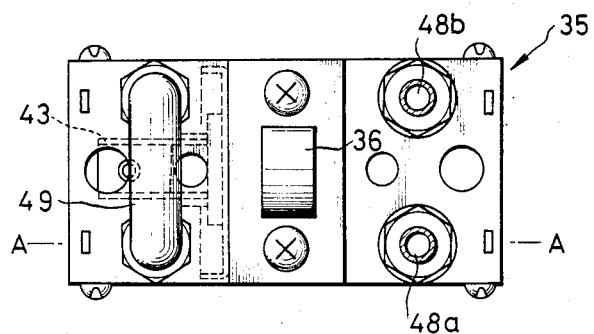
FIG. 4
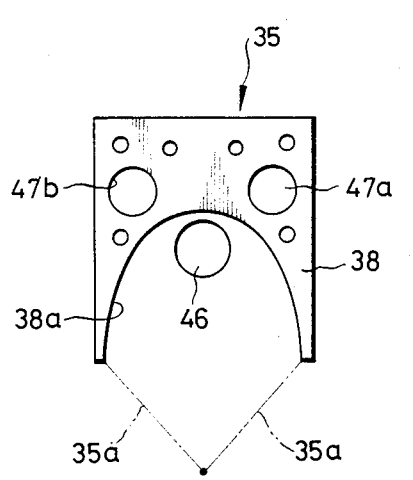
FIG. 5
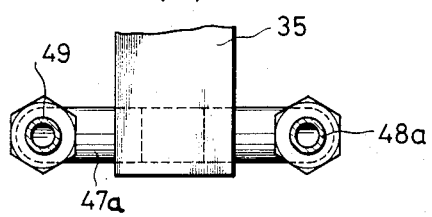
FIG. 6
(A)
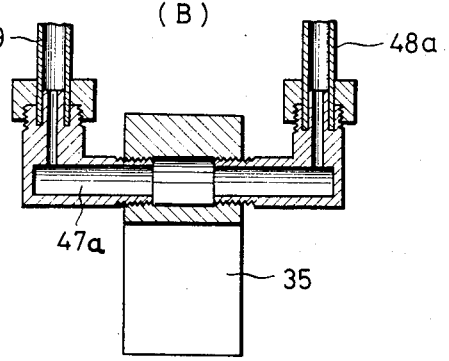
(B)

(A)

(B)

SOLDERING APPARATUS

BACKGROUND OF THE INVENTION

The present invention relates to an apparatus for assembling components by soldering, especially miniature IC-packages on a printed circuit board and, more particularly, to an apparatus for soldering the lead pins on an IC-package with the corresponding lead lines on a printed circuit board using radiant heat, for attaining firm and reliable connections in a short time.

Miniature IC-packages have the advantage that they permit higher package density by mounting many IC-packages on a single printed circuit board, especially in memory elements. Such a type of IC-package includes, for instance, an SOP (Small Outline Package) having lead pins extending in two directions, or an FPP (Flat Plastic Package) having lead pins extending in four directions.

As will be understood, such IC-packages tend to have their lead pins arranged in more and more dense distribution in accordance with the growing general demand for multiple functionalities of LSI.

There have been known as the means for soldering the lead pins on an IC-package to the corresponding lead lines on a printed circuit board, for example, heating with a soldering iron, heating by a pulse heater, infrared ray heating with reflowing, and heating by hot air [see, for example, "Denshi-Zairyo" (Electronics Materials) No. 2, p. 37 (1985)] and, as proposed recently, the use of laser beams ["Keikinzoku-Yosetsu" (Welding of Light Metals) Vol. 17, No. 1 (1979)]. The known techniques have, however, many drawbacks. Thus, a miniature IC-package has in general its lead pins disposed with a narrow pin pitch. In this case, positioning the lead pins in alignment with the soldering pad requires higher accuracy when the number of lead pins is large and, in addition, leads to the occurrence of electric short circuiting across the neighboring pins due to excessive application of solder, so that minute and close control of the operations and sophisticated techniques for the printing application of the solder paste and for the mounting of the IC-packages on the printed circuit board, etc., are required.

As materials for the printed circuit board, those exhibiting very low heat resistance, such as paper, phenolic resin and so on, have recently come to find practical use for the sake of economy, so that printed circuit boards are apt to suffer from thermal damage when employing, in particular, an infrared ray heating with reflowing, heating with hot air, or laser beam heating. When a laser beam is employed, stable soldering may be achieved, since there occurs no degradation of the material of the heating head with time by, for example, formation of an oxide layer and so on, as contrasted to the technique using thermal conductivity, such as the use of a soldering iron and so on. The technique of using a laser beam has, however, the disadvantage that a complicated device is necessary for positioning the optical exit member for the laser beam to be guided through a flexible fiber so as to focus the beam onto the site to be soldered. Here a part of the laser output energy will be scattered onto portions other than the sites to be soldered due to diffraction of the beam, and this injures the material (IC-packages, printed circuit board and so on), resulting in a degradation of the final product.

OBJECTS OF THE INVENTION

The principal object of the present invention is to provide a soldering apparatus capable of establishing a firm connection of, for example, the lead pins on IC-packages to be assembled on a printed circuit board, with the corresponding lead lines on the printed circuit board, efficiently, by soldering, within a short period of time, with a sufficient connection, whilst preventing bridging between the neighboring lead pins due to leakage of the molten solder, even for an IC-package with a dense arrangement of the lead pins.

Another object of the present invention is to provide soldering apparatus which is capable of soldering various types of objects and permits to effect, in a very simple manner, an accurate focussing of the radiant heat from a heat source onto the site to be processed by soldering.

Still another object of the present invention is to provide a soldering arrangement which does not thermally damage portions of the work other than the sites to be processed by soldering, even in the case of, say, a printed circuit board consisting of a material having very low heat resistance.

A further object of the present invention is to provide soldering apparatus which has a compact structure to minimize the space occupied and is not expensive, capable to attaining economy of energy consumption, and which is easy to transport, handle and emplace.

Other objects and advantages of the invention will become evident from the following description.

BRIEF SUMMARY OF THE INVENTION

These and other objects of the present invention are achieved according to the present invention by soldering apparatus for effecting a firm connection, say, of lead pins on IC-packages mounted on a printed circuit board with the corresponding lead lines on the printed circuit board with solder, by arresting the workpiece such as an IC-package at a predetermined position on the other workpiece such as a printed circuit board on a work support, in order to put the lead pins and the corresponding lead lines, on which the solder has previously been applied into contact with each other, and then irradiating the sites of contact with radiant heat to cause soldering, comprising a mounting base provided with a pair of arms arranged diametrically opposite each other, with or without a further pair of arms disposed at right angles to the first said pair; radiant heat sources for producing radiant heat rays and focussing them onto said sites of contact of the lead pins on the IC-package with the lead lines on the printed circuit board to be soldered, each of said radiant heat sources being hingedly connected to the end of each of said arms so as to permit to each a voluntary adjustment of the angle of inclination of the heat source around an axis of angular adjustment; and a support shaft adjustable in its vertical position relative to the work support, said support shaft passing slidably through said mounting base and supporting a press plate for bearing at its lower end on the IC-package.

The number of arms employed corresponds thus to the number of heat sources employed. When two heat sources are employed, two bundles of radiant heat rays are directed simultaneously to the portions to be processed by soldering. These bundles of radiant rays are focussed each in a form of a segment of a line onto the respective rows of sites to be soldered on the opposite sides of the IC-package. When four radiant heat sources are used, four bundles of radiant heat rays are focussed simultaneously onto four rows of soldering sites disposed in a rectangle whose sides correspond to each row of the sites to be soldered. The distance between the opposite pairs of lines can be adjusted by rotating the heat sources around each axis for angular adjustment by releasing and tightening the corresponding bolt-nut unit disposed on said axis for the purpose of angular adjustment. The distance between the paired lines corresponds to the distance between the two linear rows of the sites to be soldered on the opposite sides of the IC-package. The heat source should preferably consist of a near-infrared ray lamp.

BRIEF DESCRIPTION OF THE DRAWINGS

FIG. 4 is a plan view of the lamp unit corresponding to FIG. 3;

FIG. 5 is a side view of a mirror body in the lamp unit;

FIG. 6 shows a cooling water circulation system for the mirror body of the lamp unit in a plan view (A) and in a vertical section (B) along the line A—A in FIG. 4;

DETAILED DESCRIPTION OF THE PREFERRED EMBODIMENTS

1. Arrangement of the First Embodiment

Figure 1:
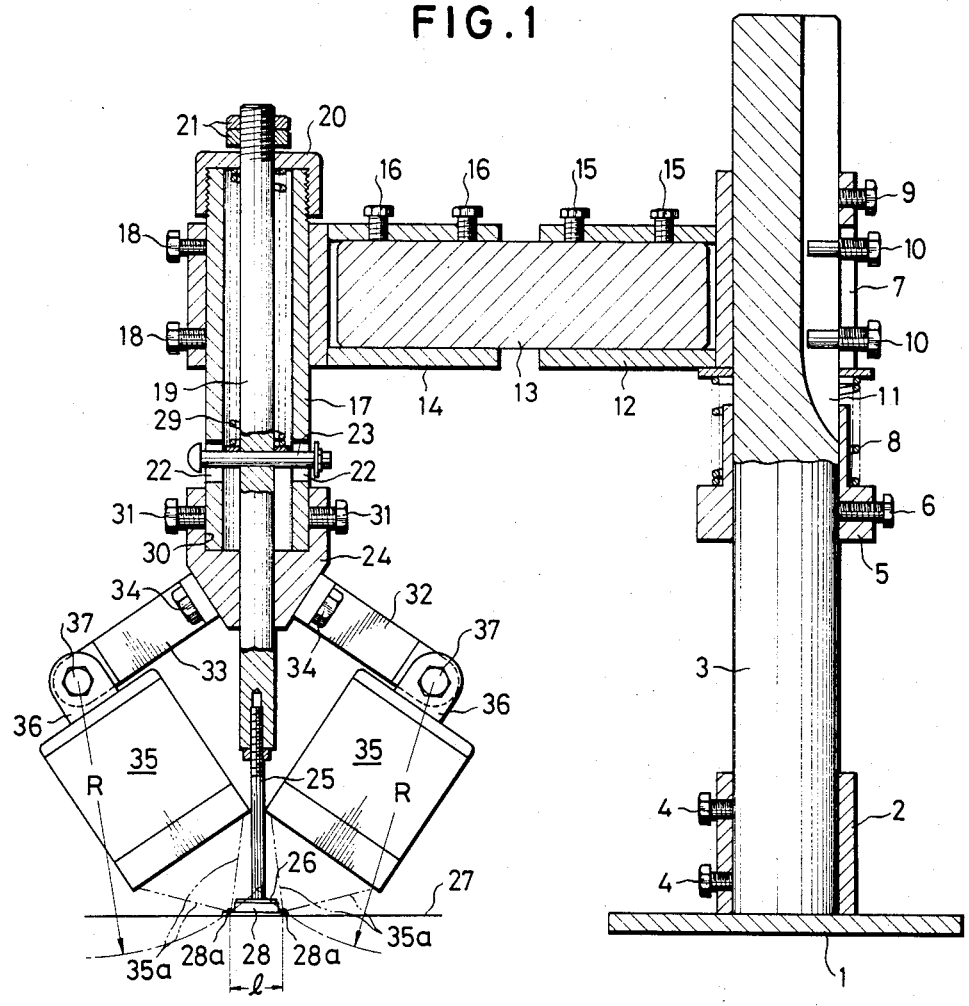
FIG. 1 shows the essential parts of a first embodiment of the apparatus according to the present invention, partly in section.
Figure 2:
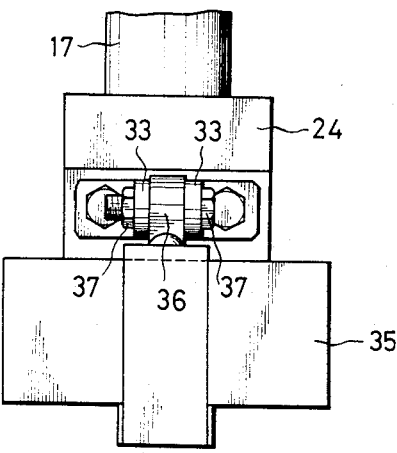
FIG. 2 shows the connection part of a heat source lamp unit in a plan view.

In FIG. 1, a general view of the essential parts of a first embodiment of the soldering apparatus according to the present invention is shown in a partly sectioned elevation. The apparatus is fixedly mounted on a base 1, which is connected fixedly to a stationary support (not shown), such as a work table. The base 1 carries a mounting cylinder 2 in which the lower end of a standard 3 is inserted and fixed by several tightening screws 4. On the standard 3 is fixed a support member 5 by slipping thereon and tightening by a screw 6 at an appropriate height. A sleeve 7 is slipped on the standard 3 and fixed at a suitable position by tightening screws 9. Between the sleeve 7 and the support member 5, a coil compression spring 8 is disposed. Two key screws 10 are attached to the sleeve 7 so as to extend into a keyway 11 provided in the standard 3 to prevent rotation of the sleeve 7.

Sleeve 7 carries a bracket 12 having a recess into which one end of a connection rod 13 is inserted and fixed by tightening screws 15. The other end of the connection rod 13 is inserted into a recess of another bracket 14 arranged on a sleeve supported on a tubular support 17 and is locked with tightening screws 16. Both ends of the connection rod 13 are thus held firmly in the respective recesses so as to permit adjustment of the depth of insertion to fix the distance between the standard 3 and the tubular support 17. The sleeve of the bracket 14 is supported on the tubular support 17 by slipping thereon and fixing with tightening screws 18. The tubular support 17 serves for supporting the soldering apparatus according to the present invention.

Inside the tubular support 17 is arranged a support shaft 19 extending therethrough and projecting at the upper end thereof out of a cap 20 closing the upper end of the tubular support 17. On the upper end of the support shaft 19 projecting above the cap 20, a double nut 21 is screwed so as to permit fine adjustment of the vertical position of the support shaft 19 by manipulating the double nut 21. At a lower portion of the tubular support 17, two vertical slots 22 are disposed diametrically relative to the support shaft 19, in which a guide pin 23 is disposed with play. The guide pin is free to move vertically within the slots 22. The adjustment of this vertical movement in the slots 22 is effected by the manipulation of the double nut 21.

The lower end of the support shaft 19 projects down through a mounting base 24 to be described hereinafter. On the lower end of the support shaft 19 is arranged a rod 25 which carries at its lower end a press plate 26 for arresting the IC-package on the printed circuit board by pressing on it. The upper part of the rod 25 is threaded so as to engage with the corresponding thread formed in the lower end of the support shaft 19 to connect therewith.

The press plate 26 disposed at the lower end of the rod 25 arrests the IC-package 28 mounted on a printed circuit board 27 by pressing down the upper face thereof, in order to ensure against any displacement between the IC-package 28 and the printed board 27. For alleviating the shock upon contact of the press plate 26 with the IC-package 28, a coil compression spring 29 is interposed between the guide pin 23 and the cap 20 within the tubular support 17. While the press plate 26 is formed in this embodiment in a nearly rectangular configuration, it is possible that the press plate 26 can have a greater size than the IC-package 28 and be provided with suitable passageways, such as slots or the like, to allow penetration of the heat rays to the soldering sites.

Figure 3:
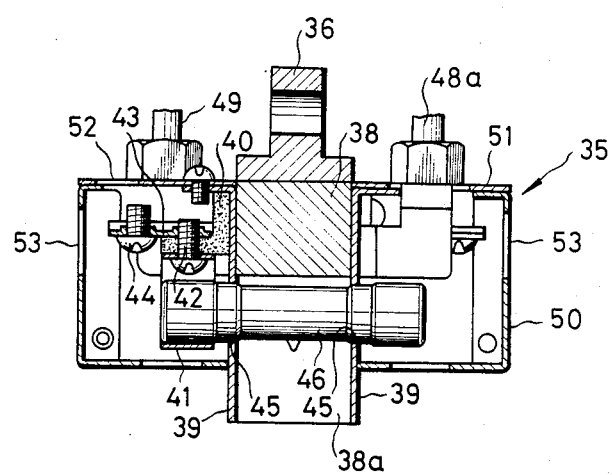
FIG. 3 illustrates one embodiment of a heat source lamp unit in a vertical section.

The mounting base 24 has a cut-out 30 at its upper face, adapted to receive the lower end of the tubular support 17. The lower end of the tubular support 17 is inserted in the cut-out 30 and is fixed by tightening screws 31 to form an integral body therewith. On the mounting base 24, two arms 32 and 33 are arranged diametrically with respect to the support shaft 19 and are fixed by screws 34. Each of the arms 32, 33 carries a heat source in the form of a lamp unit 35 at its distal end so as to allow free adjustment of the angle of inclination of the lamp unit. Thus, the heat source lamp unit 35 has at the center of its base a connection member 36, as best shown in FIGS. 3 and 4, and the two lamp units 35 are supported on the arms 32, 33 each by suitable fastening member, such as a bolt-nut assembly, so as to permit adjustment of the inclination angle of the lamp unit, whereby a desired adjustment of the location of the focussed line of the heat rays onto the sites to be soldered on the printed circuit board can be attained. Thus, each of the focussed lines of the lamp units 35 moves on a circular locus having a radius R around an axis of angular regulation 37 and is fixed in a requisite position by the bolt-nut assembly.

When an IC-package 28 having two rows of lead pins 28a on opposite sides thereof is processed by soldering, the heat source lamp units 35 are set by the bolt-nut assemblies so that each focussed line of heat rays will coincide with the row of the spots to be soldered on the printed circuit board on both sides of the IC-package 28, by adjusting the angle of inclination of the lamp units 35 around the axes 37 in such a manner that a proper distance (l) for the soldering rows is left between the two focussed lines. Thus, it is possible to vary the angle of inclination of each of the lamp units so as to adjust the location and distance of the focussed lines to meet any specified condition even if the size of the IC-package 28, and thus, the distance "l", is altered in the course of producing a multi-package unit.

Turning now to the heat source lamp unit 35 shown in more detail in FIGS. 3 to 6, this includes a mirror body 38 having a mirror face 38a. Both ends of the mirror body 38 are closed each by a reflector plate 39. The mirror face 38a and the internal surfaces of the reflector plates 39 are plated with, for example, gold, to increase their reflectivity. A ceramic base 40 of L-shaped cross section is provided, on which a socket 41 for the heat source lamp is fixed by a small screw 42. The small screw 42 connects also a terminal plate 43 for the lamp with the power source via another small screw 44 and a lead wire (not shown). The reflector plates 39 have each a perforation 45, through which the lamp 46, which is a near-infrared ray lamp having a linear form, is inserted, so as to rest itself in the socket 41 by its one end. The mirror body 38 is provided with a pair of cooling water channels 47a, 47b in spaced parallel relation. The cooling water is supplied from one end of the channel 47a and flows therethrough leaving the other end through a connection path 49 and entering the other channel 47b at its one end 48a and is discharged from the other end 48b. The entire mirror body 38 is accommodated in a housing 50 which is covered on its upper face by a cover plate 51. A hole 52 serves to guide the electric current cable (not shown) connected to the lamp. The housing 50 is provided with slits 53 serving for air ventilation.

Figure 7:
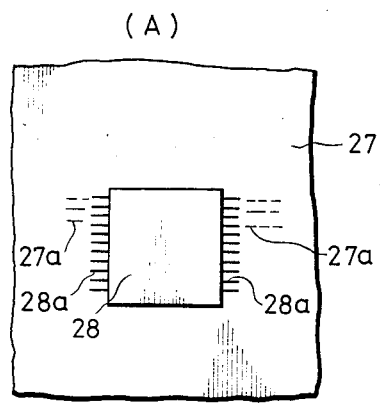
FIG. 7 illustrates an IC-package mounted on a printed circuit board in a plan view (A) with its lead pins indicated in a symbolized form, and in a vertical section (B) with the printed circuit board and IC-package being indicated both in a symbolized form.
Figure 7:
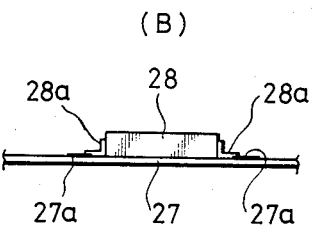

There will now be described a soldering operation in which an IC-package 28 having a pair of rows of lead pins 28a on two opposite sides of the package is processed by soldering each lead pin with the corresponding lead line 27a on the printed circuit board 27, as shown in FIG. 7.

The printed circuit board 27 is placed on the work table underneath the support shaft 19. The IC-package 28 is mounted on the printed circuit board 27 at a predetermined position and the relative position of the two is adjusted so as to align each lead pin 28a with the corresponding lead line 27a on which the solder has previously been applied. After the positioning of the two has been achieved as above, the heat source lamp units 35 are set so as to cause each of the focussed lines of heat rays to coincide with the associated row of the sites to be soldered, namely, the positions at which the lead lines 27a are overlaid by the lead pins 28a, by adjusting the bolt-nut assemblies through which pass the axes 37.

Figure 10:
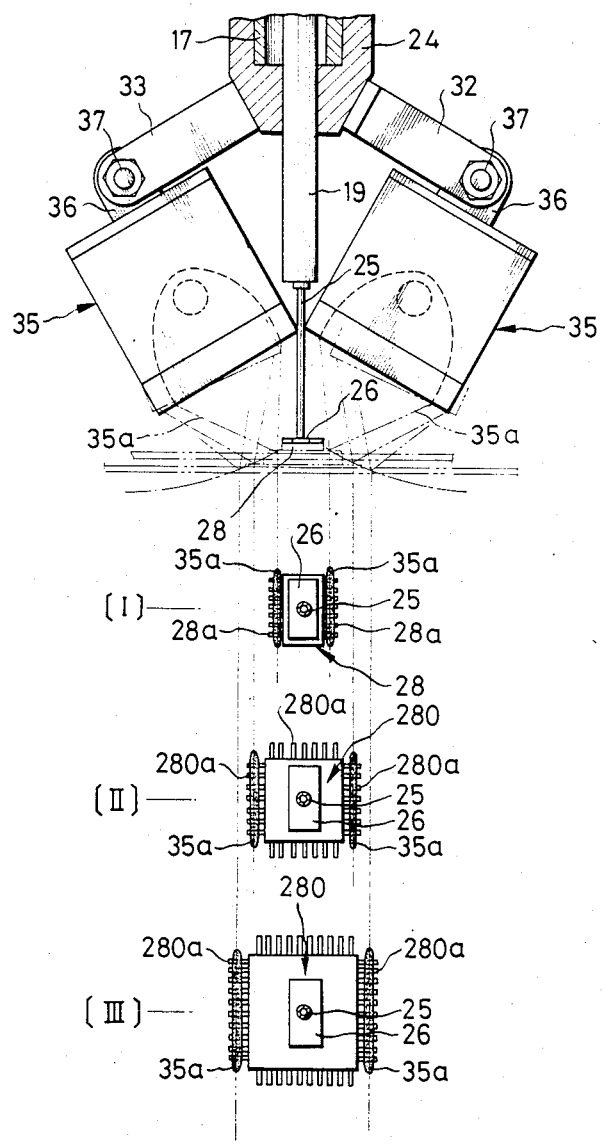
FIG. 10 is an explanatory illustration showing three IC-packages having different sizes, in which one has a pair of opposite rows of lead pins and the others have each two pairs of opposite rows disposed on the four sides of the package, to be applied to a printed circuit board.

The support shaft 19 is lowered to let the press plate 2 come to bear on the IC-package 28. In this condition, the heat source lamps 46 are energized, which produce each a bundle of heat rays 35a, which a focussed onto the soldering site and produces a temperature of, for example 200°–900° C. The heat rays are reflected by the mirror face 38a and are focussed onto the soldering site in the form of a segment of a line overlying the row of connection points of the lead pins 28a on the IC-package with the lead lines 27a on the printed circuit board (as best illustrated in FIG. 10). The soldering can be effected within a very short period of time (5–8 seconds) in both the rows of the connection points on both sides of the IC-package 28 simultaneously.

For an IC-package 280 (FIG. 10) provided with four rows of the lead pins 280a on the two pairs of opposite sides thereof, the same procedures as explained above are first performed and, then the support shaft 19 is raised against the force of the spring 29 and the printed circuit board is rotated 90° about a vertical axis and the same procedures are repeated, so as to effect the soldering on the other two sides, as shown in FIG. 10 (II). The size of the IC-package of FIG. 10 (III) is somewhat greater than that of FIG. 10 (II). For processing the packages shown in (II) and (III) of FIG. 10, the angle of inclination of the heat source lamp units has to be readjusted by the bolt-nut units adjacent axes 37 before the operation, since the distance "l" between the rows of soldering sites is greater than that of the IC-package shown in (I) of FIG. 10.

During operation, the mirror body 38 is cooled by flowing cooling water through the channels 47a, 47b, as explained previously, and also by the ventilating air through the ventilation slits 53.

2. Arrangement of the Second Embodiment

Figure 8:
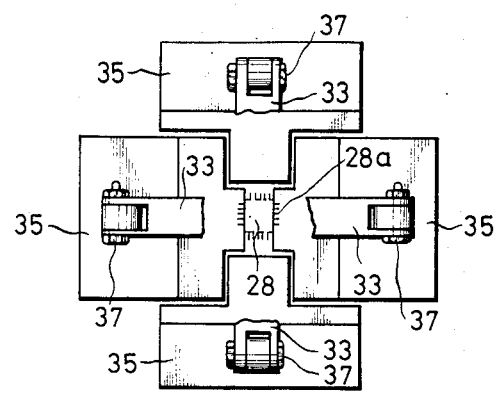
FIG. 8 is a plan view of a second embodiment of the apparatus according to the present invention in the vicinity of the heat source lamp units.
Figure 9:
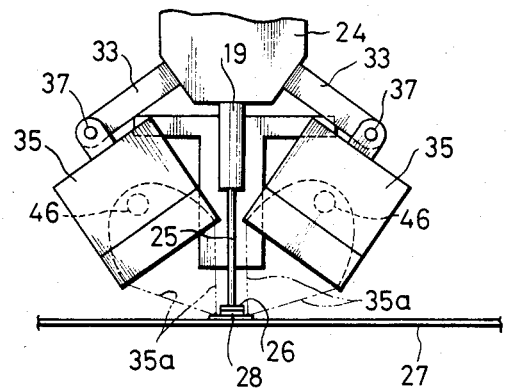
FIG. 9 is a side view of the embodiment of FIG. 8.

FIGS. 8 and 9 illustrate a second embodiment of the soldering apparatus according to the present invention, in which two pairs of heat source lamp units are arranged rectangularly to each other. By this arrangement, four rows of the soldering sites on both pairs of opposite sides of the IC-package 280 can be soldered at a time.

Four heat source lamp units 35 are disposed around the mounting base 24 in two pairs arranged rectangularly to each other. Each of the lamp units is connected to an arm 33 in the same manner as in the arrangement of the first embodiment, and thus can be adjusted in its inclination angle by a bolt-nut assembly at 37. Thus, in this arrangement, another pair of lamp units having the same construction as in the first embodiment is disposed in rectangular direction to the first pair of lamp units of the first embodiment wtih the same connection means. Here, however, the second pair of lamps units is not disposed on the same vertical level as the first one but the two pairs are arranged at two different levels, whereby the adjustment of the inclination angle of each lamp unit can be accomplished without disturbance of any of the other lamps units. All the other parts have the same structure as in the first embodiment and hence the description of their details is omitted.

The present invention is not restricted only to the embodiments set forth above but comprises also every modification and alteration of each specific part of the arrangement within the scope and spirit of the invention.

What is claimed is:

1. Soldering apparatus for producing at least one pair of parallel lines of heat, comprising a mounting base provided with a pair of diagonally disposed arms secured to the base at their inner ends and terminating away from the base in distal ends;

heat source lamp units producing radiant heat rays and focussing them onto at least one pair of spaced parallel lines;

means hingedly connecting said lamp units to the distal ends of said arms so as to permit adjustment of the angle of inclination of the lamp units around parallel axes of angular adjustment; and a vertically adjustable support shaft passing slidably through said mounting base and supporting a press plate for bearing against a workpiece to be soldered at its lower end.

2. Soldering apparatus according to claim 1, wherein the heat source of said lamp unit consists of a near-infrared ray lamp of linear form.

3. Soldering apparatus according to claim 1, wherein two pairs of arms are disposed on the mounting base in rectangular relation to each other and are connected each at said distal end to a said heat source lamp unit for angular adjustment, each pair of said arms being disposed at a different vertical level from the other pair.

4. Soldering apparatus according to claim 1, wherein the support shaft is disposed within a tubular support and is urged upwardly by a coil compression spring disposed inside the tubular support.

5. Soldering apparatus according to claim 4, wherein a double nut is screwed on the support shaft at its upper end projecting above the tubular support, so as to allow an adjustment of the force of said spring by manipulating said double nut.

6. Soldering apparatus according to claim 1, wherein the heat source lamp unit is connected to the distal end of each of said arms on the mounting base by means of a bolt-nut assembly for angular adjustment.

* * * * *